United States Patent
Nolan et al.

(10) Patent No.: US 7,410,542 B2
(45) Date of Patent: Aug. 12, 2008

(54) VARIABLE ENVIRONMENT, SCALE-ABLE, ROLL TO ROLL SYSTEM AND METHOD FOR MANUFACTURING THIN FILM ELECTRONICS ON FLEXIBLE SUBSTRATES

(76) Inventors: Paul Terrance Nolan, 135 Sierra Vista Rd., Montecito, CA (US) 93108; Armando Martin Arias del Cid, 306 Northridge Rd., Santa Barbara, CA (US) 93105

( * ) Notice: Subject to any disclaimer, the term of this patent is extended or adjusted under 35 U.S.C. 154(b) by 0 days.

(21) Appl. No.: 11/831,946

(22) Filed: Jul. 31, 2007

(65) Prior Publication Data

US 2007/0266942 A1    Nov. 22, 2007

Related U.S. Application Data

(60) Provisional application No. 60/850,760, filed on Oct. 10, 2006.

(51) Int. Cl.
*C23C 16/00* (2006.01)

(52) U.S. Cl. .......................... 118/718; 118/33; 118/50; 118/719; 118/733; 204/298.23; 204/298.24; 427/171; 427/172; 427/255.5

(58) Field of Classification Search ................. 118/33, 118/50, 718, 719, 733; 427/171–172, 255.5; 204/298.23–298.24
See application file for complete search history.

(56) References Cited

U.S. PATENT DOCUMENTS

| | | | |
|---|---|---|---|
| 4,637,342 A | 1/1987 | Kamiya et al. | |
| 5,016,562 A | 5/1991 | Madan et al. | |
| 5,151,303 A * | 9/1992 | Hales et al. | 118/718 |
| 5,753,531 A | 5/1998 | Frey | |
| 5,773,088 A * | 6/1998 | Bhat | 427/294 |
| 6,184,458 B1 | 2/2001 | Murakami et al. | |
| 6,273,955 B1 | 8/2001 | Yoshino et al. | |
| 6,488,777 B2 * | 12/2002 | Madan et al. | 118/718 |
| 6,869,484 B2 * | 3/2005 | Hunt et al. | 118/718 |
| 6,974,976 B2 | 12/2005 | Hollars | |
| 7,153,180 B2 | 12/2006 | Cok et al. | |
| 7,169,232 B2 | 1/2007 | Strip et al. | |
| 2004/0142104 A1 | 7/2004 | Wooley | |
| 2006/0263177 A1 | 11/2006 | Van der Meulen | |

* cited by examiner

*Primary Examiner*—Karla Moore
(74) *Attorney, Agent, or Firm*—Felix L. Fischer

(57) ABSTRACT

A roll to roll, film forming system overcoming the shortcomings of current roll to roll processing is presented; The roll to roll enabled cartridge is loaded with a bolt of fresh flexible substrate. A skate couples with a cartridge, forms a seal with the cartridge's bottom aperture and drives the cartridge along a rail to an array of deposition heads. A head mates with the cartridge top forming a pressure seal around the variable area deposition aperture. The mating of the skate, cartridge and head form a pressure vessel wherein a film forming environment may be maintained. As the substrate advances past the deposition aperture a layer is formed, potentially from bolt end to bolt end. Device growth continues from one head to another, as grown device encapsulation seal inclusive, aperture environmental seals applied, labeled cartridge is routed to dock, skate returns to system start.

11 Claims, 5 Drawing Sheets

VARIABLE ENVIRONMENT, SCALE-ABLE, ROLL TO ROLL SYSTEM AND METHOD FOR MANUFACTURING THIN FILM ELECTRONICS ON FLEXIBLE SUBSTRATES

CROSS-REFERENCE TO RELATED APPLICATION

This application claims the priority date of provisional application Ser. No. 60/850,760, filed on Oct. 10, 2006 for A VARIABLE ENVIRONMENT, ROLL TO ROLL, OLED, OPV, ETC, MANUFACTURING PROCESS

FIELD OF THE INVENTION the present invention generally relates to the roll to roll process of manufacturing thin film electronics on flexible substrates. Specifically it relates to pressure enabled enclosure-based manufacturing of thin film electronics on flexible substrates providing for a plurality of layer formation and virtually any method of layer deposition, formation.

BACKGROUND OF THE INVENTION

In seeking a way to manufacture (via roll to roll processing) highly efficient, very low cost organic photovoltaics, organic light emitting diode arrays, organic thin film transistor arrays, thin film transistor arrays, etc, the realization was made that the invention could manufacture virtually all flexible substrate based thin film electronics.

SUMMARY OF THE INVENTION

The present invention provides a pressure vessel that enables versatile roll to roll processing of thin film electronics. The invention also provides for scale-able configurations for assembly-line production facilities for the ubiquitous manufacture of thin film electronics. The primary aspects of the invention provide a pressure vessel for applying differing pressures, temperatures, etc. as needed for multiple distinct, working processes required for forming films of differing materials on the flexible substrate. This pressure vessel provides for the formation of a plurality of layers on a flexible substrate via multiple roll to roll sequential, non-sequential processing steps or hybrids of these. Moreover the cartridge component of the pressure vessel allows for substrates to be loaded, conveyed, processed, sealed, stored and transported in a single container (cartridge).

BRIEF DESCRIPTION OF THE DRAWINGS (FIGURES)

Figure 1:
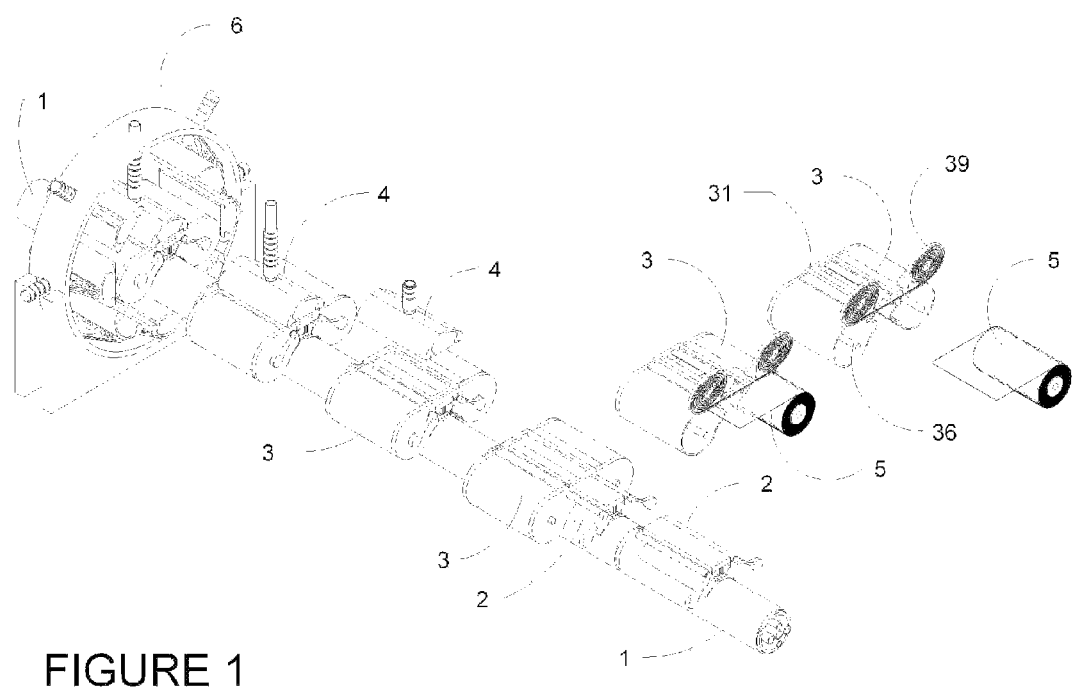
Figure 2:
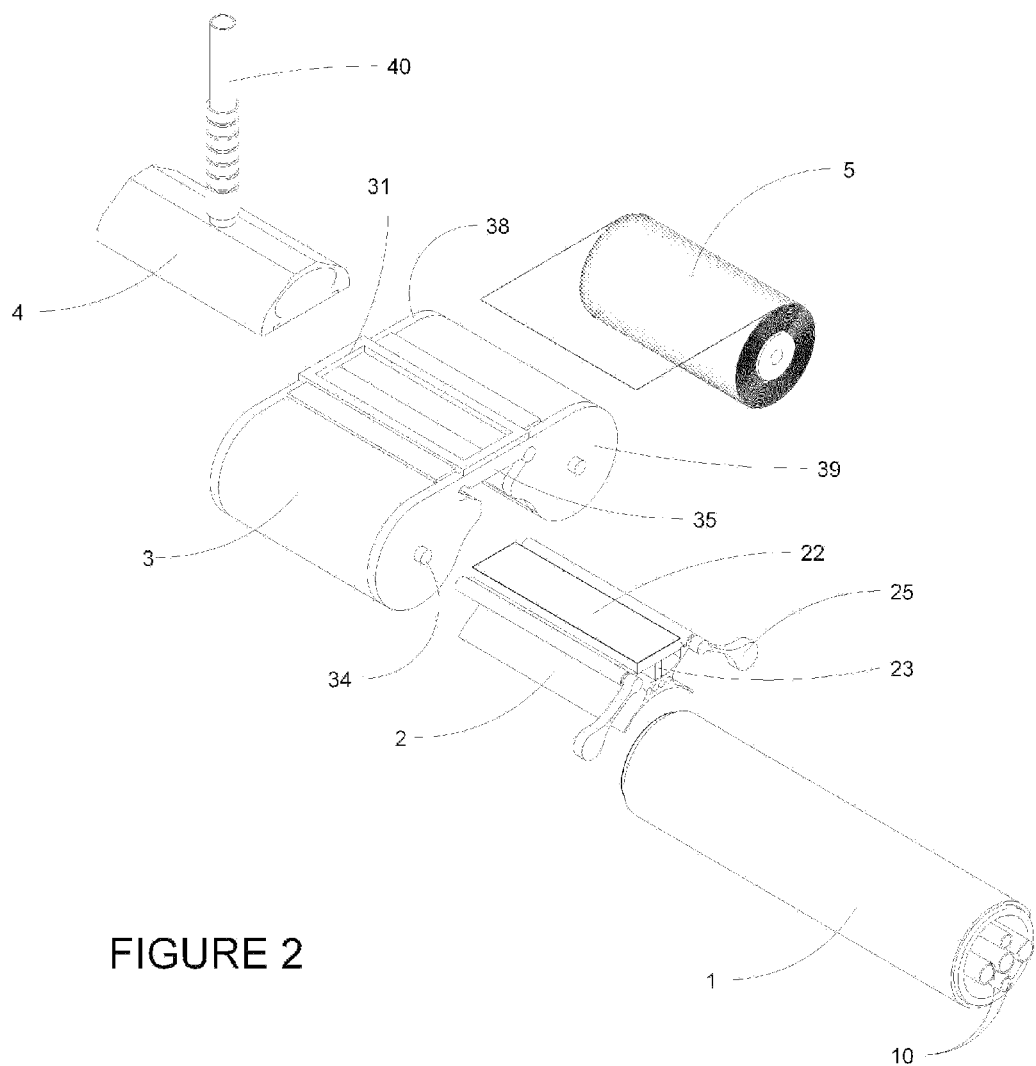
Figure 3:
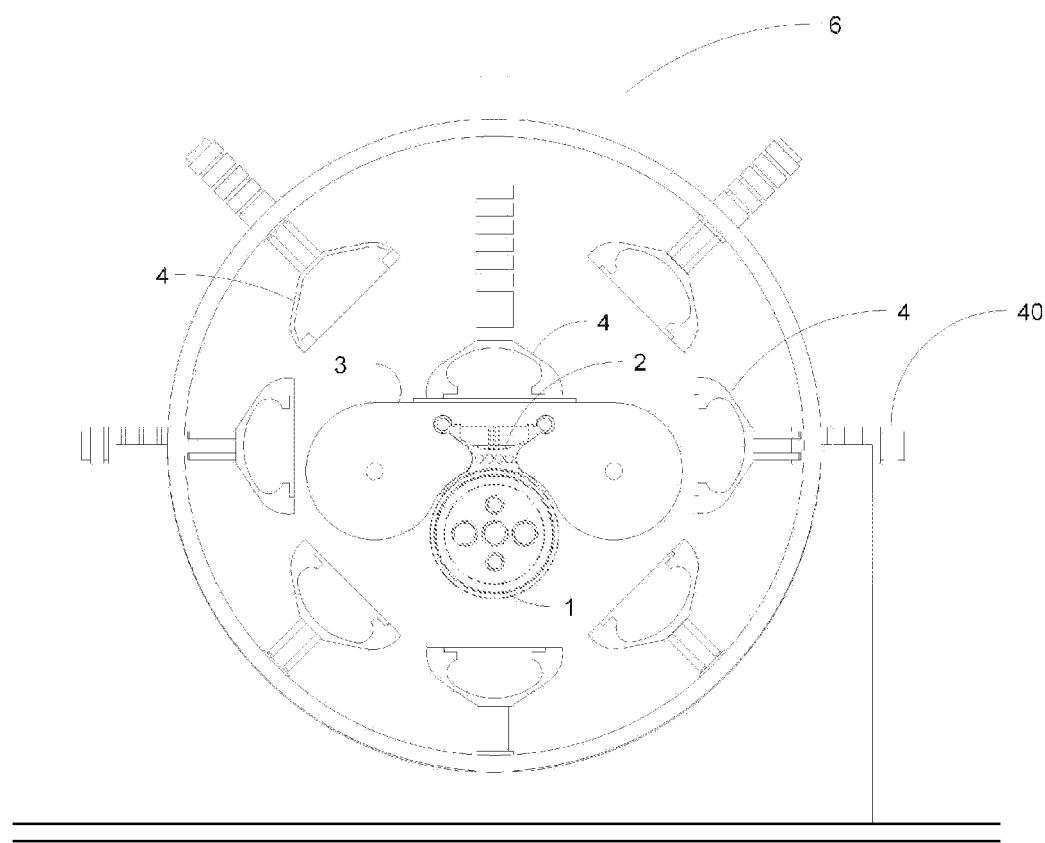

FIG. 1: the System Components depicted to generally indicate the system Methodology FIG. 2: some System Components, a larger view of the Rail, Skate, Cartridge and Head FIG. 3: System Components Elevation FIG. 4: a Section View through the Pressure Vessel FIG. 5: a Section view through the Cartridge

DETAILED DESCRIPTION OF THE INVENTION

Figure 5:
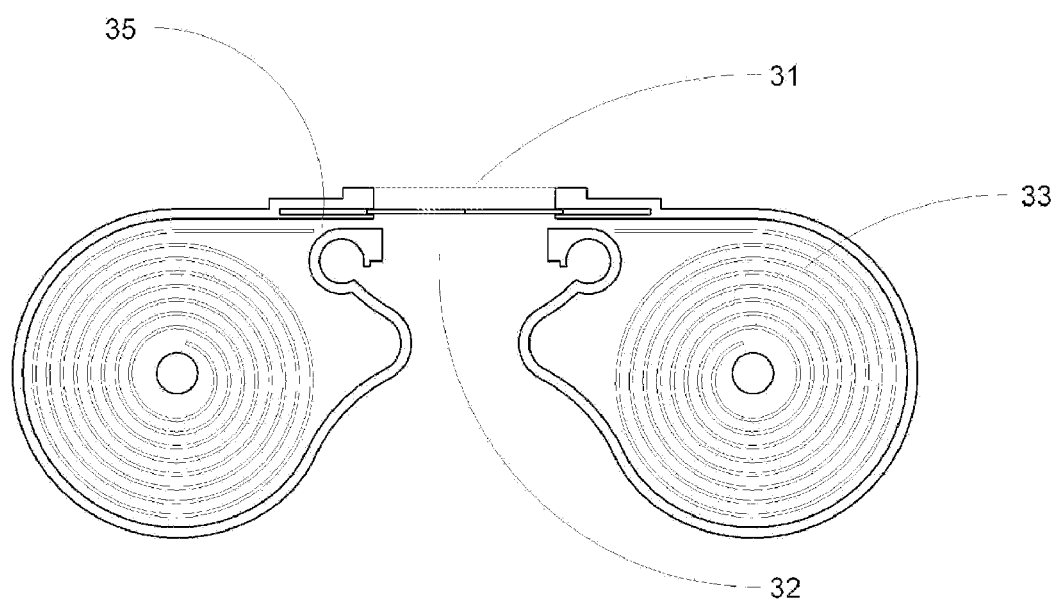

1) THE SYSTEM AND METHOD: in FIG. 1 a cartridge 3 is loaded with a fresh bolt of flexible substrate 5 via the cartridge door 39. The bolt is placed on one of the axles 36 concentrically mounted in the fixed capping end wall (FIG. 2:38) of each cylindrical lobe of the cartridge. These lobes are joined by a continuous web forming a hollow sheath (FIGS. 2, 5:35). The web is penetrated by top (FIGS. 1, 2:31) and bottom (FIG. 5:32) apertures. The leading edge of the substrate is fed through the sheath passing between both top (variable area) and bottom (fixed area) apertures and fixed by a clamping mechanism (present on each axle and not shown) to the axle in the adjacent cylinder. Thus the substrate is readied for roll to roll action. System control initiates and manages method functions as follows: The skate 2, mounted on the rail 1 couples with the cartridge 3 forming a pressure seal. The skate moves the resultant assembly along the rail to a station 6, aligns the cartridge's variable area aperture deposition window (top aperture) with a head 4. The head mates with the top surface of the cartridge forming a pressure seal around the top aperture. A film forming environment is initiated and maintained within the skate, cartridge, head formed pressure vessel (FIG. 3: 2, 3, 4). Axle hub housing (FIG. 2:34) mounted electromechanical-rotational-drives (not shown) or geared arm couplings (not shown) cause the bi-directional, rotational, film forming, material dependent substrate feed rate within the cartridge. Film formation may proceed as material supplied via a head passes through the top aperture and onto the substrate. Film depositions may be applied from one bolt end to the other or as needed. The pressure vessel may be flushed of any potential contaminants as needed. Layer formation may continue as the skate/cartridge assembly decouples from the head and this assembly aligns with the next head. This alignment is performed by rotating the skate/cartridge assembly (about the rail) to the next head within a station or driving this assembly to a head in a different station. Processing continues through as many heads and stations (a linear or radial array of heads) as needed to complete a device and apply it's encapsulation (hermetic sealing). Once the device is completed the top and bottom apertures of the cartridge are closed, environmentally sealed, the cartridge is labeled and routed to it's dock. The skate returns to the start of the line to re-initiate.

2) System Methodology Components:

A) THE RAIL (FIG. 2:1) a hollow (circular in cross section) structural, supporting member which is the system backbone and road or track-way for advancing processing from station to station and so head to head. Internal to the rail are communication and control lines as well as conductors (FIG. 2:10) for powering processing and waste energy recycling. Slip rings, rotating or other types of electrical conductors (not shown) are present to provide the skate (described below) with power and system communications as well as providing the electrical continuity required for waste energy DC (direct current) recycled by the skate's CPTHS (described below).

B) THE CARTRIDGE: (FIGS. 1, 2, 3:3) a structural enclosure, pressure tolerant (from less than or equal to 0.1 Torr vacuum through ambient and on into positive pressure ranging up to 200 or more PSI) with two parallel, adjacent cylindrical lobes with axles (FIG. 1:36) concentrically fixed in the fixed capping end wall (FIG. 2:38) of each lobe. Electromechanical-rotational-drives or geared couplings (not shown) are housed within or mounted external (respectively) to the door mounted hub housing (FIG. 2:34) of each axle enabling the roll to roll bi-directional, rotational, uptake/feed action of the substrate. The adjacent lobes of the cartridge are joined by a continuous web forming the sheath (FIGS. 2, 5:35), through which the substrate feeds. The top of the web is penetrated by a variable area aperture deposition window (top aperture, FIGS. 1, 2:31). The bottom of the web is penetrated by an aperture (bottom aperture, FIG. 5:32) which may have essentially the same fixed dimensions as that of the top aperture and is parallel and coaxial to the top aperture. The pressure resistant cartridge door, which is one of the two capping end walls, (FIGS. 1, 2:39) provides for loading fresh substrate bolts and the safe removal of fully grown devices. Substrate sensitive, auto-adjusting substrate guides 33 (shown stylized in FIGS. 4 and 5) are located on the inner surface of each lobe's capping end walls. The guides provide the spacing required between the taken up substrate coils to prevent damage to the formed and forming layers of the device(s). Hypo/hyper-baric valves and an array of processing and quality control elements may be present.

Figure 4:
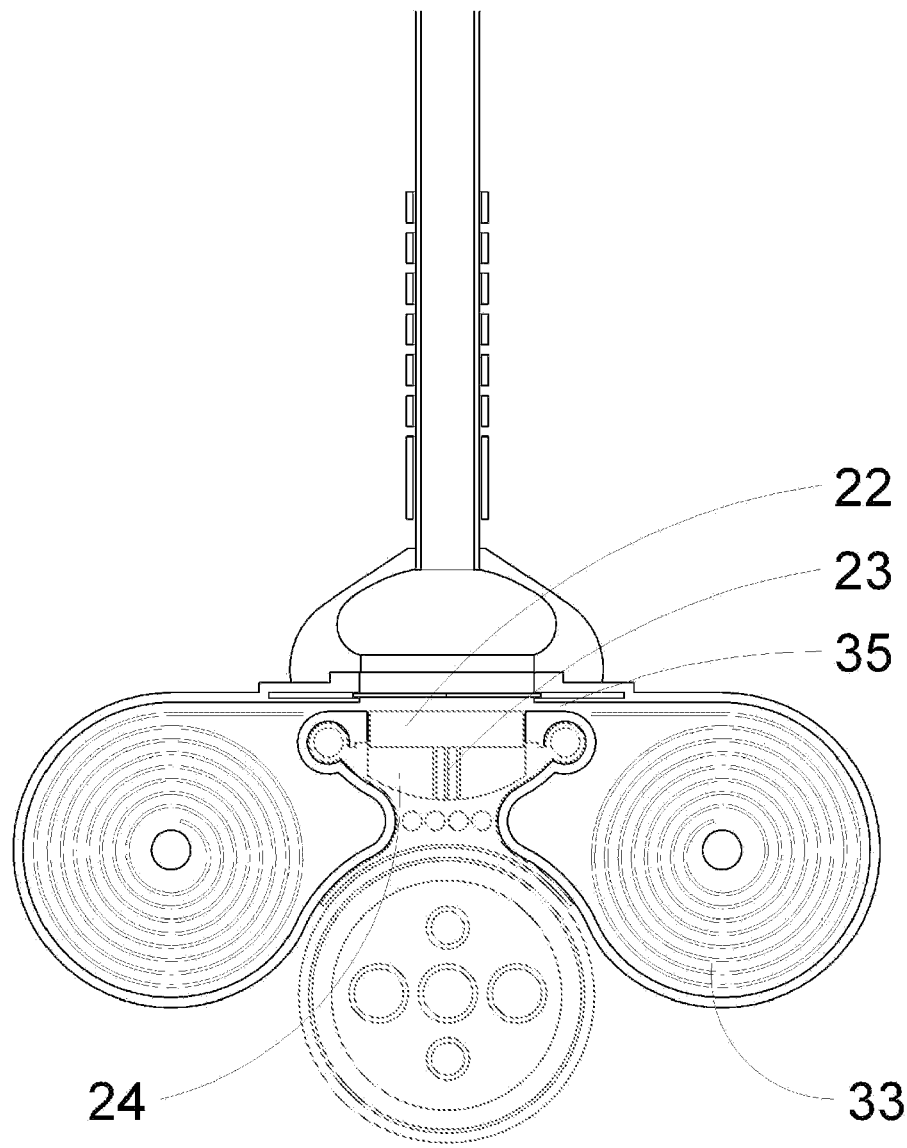

C) THE SKATE: (FIGS. 1,2,3:2) Provides for cartridge motion and alignment along and or about the rail from point to point. Contains, supports and controls the cold-plate (FIGS. 2, 4:22) thermoelectric heat sink (FIGS. 2, 4:23) assembly CPTHS (FIG. 4:24). The flexible substrate is fed across the CPTHS maintaining the substrate at constant temperature. The CPTHS consists of a highly thermally conductive plate in direct contact with parallel thermoelectric semiconductor plates which upon receiving the heat conducted through the cold-plate convert this heat to direct current (DC) electricity which may be recycled. The energy conversion capacity of the CPTHS may vary as needed by layer forming requirements by adding or subtracting thermoelectric semiconductor plates. The skate may also support geared arms (FIG. 2:25) which when joined to the geared couplings of the cartridge enable roll to roll motion of the substrate.

D) A HEAD: a generic head (FIG. 1, 2, 3:4), a pressure resistant partial enclosure is configured to mate with the cartridge's 3 top aperture, forming a pressure seal. Each head has a hollow telescoping stem (FIGS. 2, 3:40) which can apply a sealing force around the cartridge's top aperture (FIG. 2, 5: 31). The hollow stem provides for material feed and system control elements. A generic head may contain any product/device, layer specific, forming apparatus. Certain portions of certain heads must functionally withstand temperatures greater than or equal to 600 degrees Celsius. Any head may be equipped with vacuum/pressure pumps, valves required to maintain system pressure at any required level. Additionally neat gas sources and heating elements may be present.

The invention has been described in detail with reference to more than one embodiment. It is recognized that those skilled in the art will readily envision other embodiments that are within the scope and spirit of this invention. Therefore the detailed description above is not to be taken as limitation on the spirit and scope of this invention.

The invention claimed is:

1. A roll-to-roll thin film forming system for processing a flexible substrate comprising:
    a cartridge for loading the flexible substrate for a film forming process in the film forming system;
    a skate for transporting the cartridge and coupling with the cartridge to form a skate/cartridge assembly, wherein said skate moves said skate/cartridge assembly to a station and aligns said skate/cartridge assembly with the station for the film forming process;
    a rail for mounting the skate/cartridge assembly and for directing the skate/cartridge assembly to the station for the film forming process, wherein when said skate/cartridge assembly is mounted on said rail a first pressure seal is formed; and
    a head for mating with a top surface of the skate/cartridge assembly mounted on the rail to form a second pressure seal around a variable area deposition aperture provided on a top surface of the cartridge thus allowing a pressure vessel to be formed, wherein a film forming environment for the film forming process is initiated and maintained within the pressure vessel when said first pressure seal and said second seal are formed.

2. The film forming system set forth in claim 1, wherein the cartridge comprises:
    a first cylindrical lobe and a second cylindrical lobe that are parallel and closely spaced, with respect to one another;
    a continuous web that joins the first cylindrical lobe and the second cylindrical lobe to form a hollow sheath through which the flexible substrate is fed, wherein the variable area deposition aperture penetrates a top of said continuous web and a fixed area aperture penetrates a bottom of said continuous web; and
    a fixed capping end wall and a hinged capping end wall, wherein said fixed capping end wall and said hinged capping end wall enclose said first cylindrical lobe, said second cylindrical lobe and said continuous web to form a pressure resistant container.

3. The film forming system set forth in claim 2, wherein both the variable deposition aperture and the fixed area aperture each comprise: a longitudinal axis parallel to one another; and a central axis perpendicular to and horizontally equidistant from a midpoint of a central axis of each of the first cylindrical lobe and the second cylindrical lobe.

4. The film forming system set forth in claim 2, wherein both the fixed capping end wall and the hinged capping end wall have auto-adjusting, substrate-sensitive guides mounted thereon.

5. The film forming system set forth in claim 2, wherein the cartridge further comprises: a first axle and a second axle, parallel to one another and coaxially mounted to the fixed capping end wall at each of the first cylindrical lobe and the second cylindrical lobe, respectively, for support of a roll a roll action required for the film forming process on the flexible substrate.

6. The film forming system set forth in claim 5, wherein the first axle and the second axle each comprise:
    a substrate clamping mechanism disposed along the length thereof for fixing the flexible substrate thereto; and
    an electromechanical, bi-directional, rotational axle drive located within an axle hub housing mounted in the hinged capping end wall that provides for independent, driven rotation of said first axle and said second axle.

7. The film forming system set forth in claim 2, wherein the cartridge is used for loading, conveying, processing, storing and transporting the flexible substrate.

8. The film forming system set forth in claim 1, wherein the head comprises: a pressure-resistant material delivery enclosure with a telescoping, hollow stem, and wherein the telescoping, hollow stem imposes a force that forms the second pressure seal around the variable area deposition aperture on a top surface of the cartridge and allows for process and quality control.

9. The film forming system set forth in claim 1, wherein the skate comprises a power transfer unit.

10. The film forming system set for the in claim 1, wherein the rail comprises: a hollow, supporting member for advancing the skate/cartridge assembly between one or more heads and between one or more stations, and wherein internal to the rail are communication lines, control lines and conductors.

11. The film forming system set forth in claim 1, wherein the station comprises a radial or linear array of heads, and wherein said rail advances the skate/cartridge assembly between said radial or linear array of heads.

\* \* \* \* \*